(12) United States Patent
Goto et al.

(10) Patent No.: US 11,527,632 B2
(45) Date of Patent: Dec. 13, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yotaro Goto, Tokyo (JP); Katsumi Eikyu, Tokyo (JP); Yoshihiro Nomura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/316,017

(22) Filed: May 10, 2021

(65) Prior Publication Data

US 2021/0376097 A1 Dec. 2, 2021

(30) Foreign Application Priority Data

May 29, 2020 (JP) ............................. JP2020-094212

(51) Int. Cl.
*H01L 29/423* (2006.01)
*H01L 21/28* (2006.01)
(Continued)

(52) U.S. Cl.
CPC ........ *H01L 29/4234* (2013.01); *H01L 29/402* (2013.01); *H01L 29/40117* (2019.08);
(Continued)

(58) Field of Classification Search
CPC ........... H01L 29/4234; H01L 29/40117; H01L 29/402; H01L 29/513; H01L 29/66681;
(Continued)

(56) References Cited

U.S. PATENT DOCUMENTS

2014/0312417 A1 10/2014 Strasser et al.
2015/0061011 A1* 3/2015 Cheng ............... H01L 29/66681
257/344
(Continued)

FOREIGN PATENT DOCUMENTS

CN 110137260 A * 8/2019
CN 110137260 A 8/2019

OTHER PUBLICATIONS

Extended European Search Report issued in corresponding European Patent Application No. 21175589.7-1212, dated Oct. 19, 2021.
(Continued)

*Primary Examiner* — Mohammed R Alam
(74) *Attorney, Agent, or Firm* — McDermott Will & Emery LLP

(57) ABSTRACT

A gate electrode is formed on a semiconductor substrate between an n-type source region and an n-type drain region via a first insulating film. The first insulating film has second and third insulating films adjacent to each other in a plan view and, in a gate length direction of the gate electrode, the second insulating film is located on an n-type source region side, and the third insulating film is located on an n-type drain region side. The second insulating film is thinner than the third insulating film. The third insulating film is made of a laminated film having a first insulating film on the semiconductor substrate, a second insulating film on the first insulating film, and a third insulating film on the second insulating film, and each bandgap of the three insulating films is larger than that of the second insulating film.

16 Claims, 11 Drawing Sheets

(51) Int. Cl.
    *H01L 29/40*     (2006.01)
    *H01L 29/51*     (2006.01)
    *H01L 29/66*     (2006.01)
    *H01L 29/78*     (2006.01)

(52) U.S. Cl.
    CPC ...... *H01L 29/513* (2013.01); *H01L 29/66681* (2013.01); *H01L 29/7816* (2013.01); *H01L 29/518* (2013.01)

(58) Field of Classification Search
    CPC ............... H01L 29/7816; H01L 29/518; H01L 29/42368; H01L 29/66689; H01L 29/42364
    See application file for complete search history.

(56) References Cited

U.S. PATENT DOCUMENTS

2019/0378908 A1    12/2019    Park et al.
2020/0044022 A1     2/2020    Huang et al.

OTHER PUBLICATIONS

Der-Gao Lin et al., "A Novel LDMOS Structure With A Step Gate Oxide", IEDM 1995, pp. 963-966.

\* cited by examiner

SEMICONDUCTOR DEVICE AND METHOD OF MANUFACTURING THE SAME

CROSS-REFERENCE TO RELATED APPLICATIONS

The present application claims priority from Japanese Patent Application No. 2020-094212 filed on May 29, 2020, the content of which is hereby incorporated by reference to this application.

BACKGROUND

The present invention relates to a semiconductor device and a method of manufacturing the semiconductor device, for example, a semiconductor device having an LDMOS-FET and a method of manufacturing the semiconductor device.

Used as a MISFET (Metal Insulator Semiconductor Field Effect Transistor) is an LDMOSFET (Laterally Diffused Metal-Oxide-Semiconductor Field Effect Transistor, lateral diffusion MOSFET). The LDMOSFET has a high drain breakdown voltage.

There is a technique in which a structure (Stepped Oxide (SOX) structure) of making a drain side thicker than a source side is adopted as a gate insulating film of the LDMOSFET. The technique is, for example, Non-Patent Document 1 (Der-Gao Lin et al., "A Novel LDMOS Structure With A Step Gate Oxide", IEDM 1995). Increasing the thickness of the gate insulating film of the LDMOSFET on the drain side rather than that on the source side makes it possible to improve a breakdown voltage (dielectric breakdown voltage).

SUMMARY

In a semiconductor device having an LDMOSFET, it is desired to improve its reliability as much as possible.

Other problems and new features will become apparent from the description and accompanying drawings herein.

According to one embodiment, a semiconductor device includes: a semiconductor substrate; a first conductive type source region and a first conductive type drain region formed in the semiconductor substrate; a second conductive type first semiconductor region formed on the semiconductor substrate so as to surround the source region, the second conductive type being opposite to the first conductive type; and a gate electrode formed on the semiconductor substrate between the source region and the drain region via a gate insulating film. The gate insulating film has a first gate insulating film and a second gate insulating film that are adjacent to each other in a plan view. In a gate length direction of the gate electrode, the first gate insulating film is located on a side of the source region, and the second gate insulating film is located on a side of the drain region. The first gate insulating film is thinner than the second gate insulating film. The second gate insulating film is made of a laminated film having a first insulating film on the semiconductor substrate, a second insulating film on the first insulating film, and a third insulating film on the second insulating film. Each bandgap of the first insulating film and the third insulating film is larger than a bandgap of the second insulating film.

According to one embodiment, the reliability of the semiconductor device can be improved.

DETAILED DESCRIPTION

Figure 1:
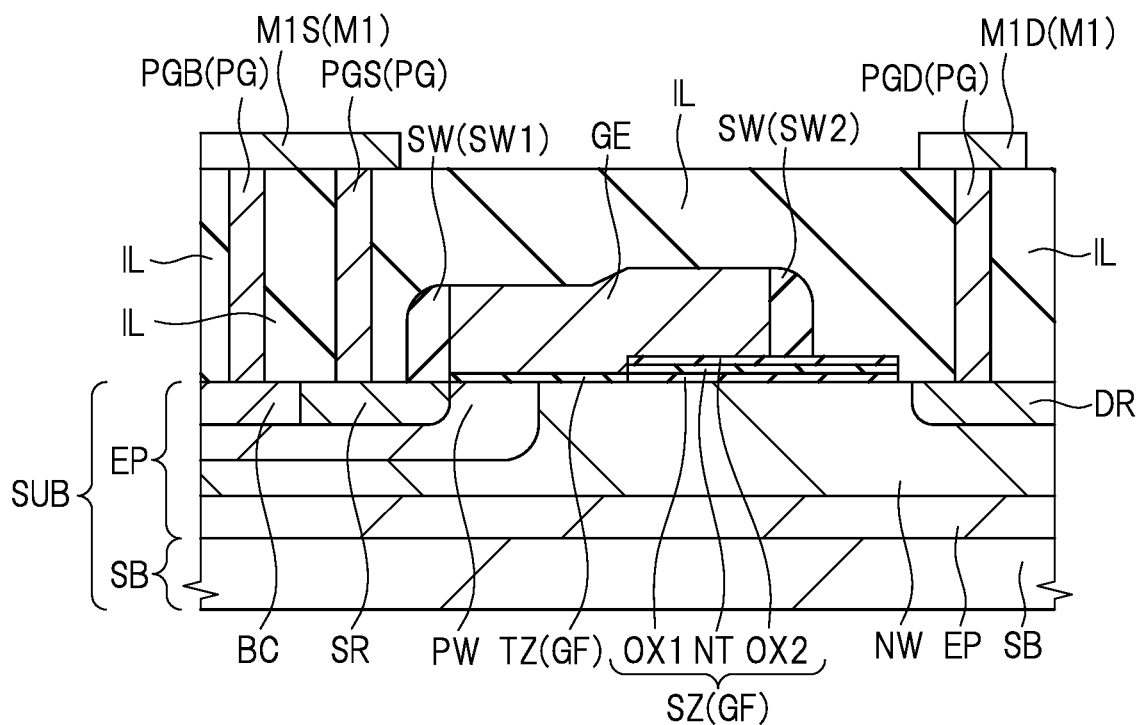
FIG. 1 is a cross-sectional view of a main portion of a semiconductor device according to an embodiment.

In the embodiments described below, the invention will be described in a plurality of sections or embodiments when required as a matter of convenience. However, these sections or embodiments are not irrelevant to each other unless otherwise stated, and the one relates to the entire or apart of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

First Embodiment

<Structure of Semiconductor Device>

A semiconductor device according to one embodiment of the present invention will be described with reference to the drawings. FIG. 1 is a cross-sectional view of a main portion of a semiconductor device according to the present embodiment, and shows a cross section substantially parallel to a gate length direction.

The semiconductor device of the present embodiment is a semiconductor device having a MISFET (Metal Insulator Semiconductor Field Effect Transistor). In this case, a semiconductor device having an LDMOSFET (Laterally Diffused Metal-Oxide-Semiconductor Field Effect Transistor) is used as the MISFET.

Incidentally, when MOSFET (Metal Oxide Semiconductor Field Effect Transistor) or LDMOSFET is mentioned in the present application, the present application includes not only a MISFET using an oxide film (silicon oxide film) as a gate insulating film but also a MISFET using as a gate insulating film an insulating film other than an oxide film (silicon oxide film). Further, LDMOSFET is a kind of MISFET element.

Hereinafter, a structure of a semiconductor device according to the present embodiment will be specifically described with reference to FIG. 1.

As shown in FIG. 1, as a MISFET, an LDMOSFET is formed on a main surface of a semiconductor substrate SUB. The semiconductor substrate SUB has: a substrate body SB serving as a semiconductor substrate made of $p^+$ type single crystal silicon or the like into which a p-type impurity such as boron (B) has been introduced; and an epitaxial layer (semiconductor layer) EP formed on the main surface of the substrate body SB and made of $p^-$ type single crystal silicon or the like. For this reason, the semiconductor substrate SUB is a so-called epitaxial wafer. An impurity concentration (p-type impurity concentration) of the substrate body SB is higher than an impurity concentration (p-type impurity concentration) of the epitaxial layer EP. The epitaxial layer EP can also be regarded as a portion of the semiconductor substrate SUB. Further, an n-type embedded layer (semiconductor layer) maybe interposed between the substrate body SB and the epitaxial layer EP.

An element separation region (not shown) made of an insulator (insulating film) is formed on the main surface of the epitaxial layer EP by using, for example, a STI (Shallow Trench Isolation) method, a LOCOS (Local Oxidization of Silicon) method, or the like.

An n-type semiconductor region (n-type well) NW and a p-type semiconductor region (p-type body region, p-type well) PW are formed on an upper portion (upper layer portion) of the epitaxial layer EP. The n-type semiconductor region NW and the p-type semiconductor region PW are adjacent to each other. An impurity concentration of the p-type semiconductor region PW (p-type impurity concentration) is higher than an impurity concentration of the epitaxial layer EP (p-type impurity concentration). The p-type semiconductor region PW also has a function as a punch-through stopper that suppresses an extension of a depletion layer from the drain to the source of the LDMOSFET. Between an n-type source region SR and an n-type drain region DR, an upper portion (upper layer portion) of the p-type semiconductor region PW located below the gate electrode GE becomes a channel formation region of the LDMOSFET.

An n-type source region (n-type semiconductor region) SR is formed in the p-type semiconductor region PW. Further, a p-type semiconductor region BC is formed in the p-type semiconductor region PW so as to be adjacent to the n-type source region SR. In other words, the p-type semiconductor region PW is formed so as to surround the n-type source region SR and the p-type semiconductor region BC. Therefore, a bottom surface and a side surface (other than a side surface contacting with the p-type semiconductor region BC) of the n-type source region SR are covered with the p-type semiconductor region PW. The n-type source region SR is an n-type semiconductor region that functions as a source region of the LDMOSFET. An impurity concentration of the p-type semiconductor region BC (p-type impurity concentration) is higher than an impurity concentration of the p-type semiconductor region PW (p-type impurity concentration).

An n-type drain region (n-type semiconductor region) DR is formed in the n-type semiconductor region NW. In other words, the n-type semiconductor region NW is formed so as to surround the n-type drain region DR. Therefore, a bottom surface and a side surface of the n-type drain region DR are covered with the n-type semiconductor region NW. The n-type drain region DR is an n-type semiconductor region that functions as a drain region of the LMOSFET. An impurity concentration of the n-type drain region DR (n-type impurity concentration) is higher than an impurity concentration of the n-type semiconductor region NW (n-type impurity concentration). The n-type drain region DR and the n-type source region SR are separated from each other in the gate length direction of the gate electrode GE.

In the gate length direction of the gate electrode GE, interposed between the p-type semiconductor region PW and the n-type drain region DR is an n-type semiconductor region NW whose impurity concentration (n-type impurity concentration) is lower than that of the n-type drain region DR. Consequently, an n-type semiconductor region NW having a lower impurity concentration than the n-type drain region DR exists between a channel formation region and the n-type drain region DR of the LDMOSFET, and the n-type semiconductor region NW can function as an n-type drift region. Therefore, in the gate length direction of the gate electrode GE, a channel formation region and an n-type semiconductor region NW exist between the n-type source region SR and the n-type drain region DR; the channel formation region is located on an n-type source region SR side; and the n-type semiconductor region NW is located on an n-type drain region DR side. The channel formation region is adjacent to the n-type source region SR and the n-type semiconductor region NW.

The gate electrode GE of the LDMOSFET is formed on a surface of the epitaxial layer EP via an insulating film (gate insulating film) GF. That is, an n-type source region SR and an n-type drain region DR are formed over the epitaxial layer EP of the semiconductor substrate SUB, and the gate electrode GE is formed via the insulating film GF over the epitaxial layer EP between the n-type source region SR and the n-type drain region DR. The insulating film GF can function as a gate insulating film of the LD MOSFET.

The gate electrode GE is composed of, for example, a single film of an n-type polycrystalline silicon film, a laminated film of an n-type polycrystalline silicon film and a metal silicide layer, or the like. A sidewall spacer (side wall insulating film) SW made of an insulating film (for example, a silicon oxide film) is formed on a side wall (side surface) of the gate electrode GE.

In a plan view, the gate electrode GE is arranged between the n-type source region SR and the n-type drain region DR. When a voltage equal to or higher than a threshold voltage is applied to the gate electrode GE, a channel (n-type inversion layer) is formed in an upper portion (upper layer portion) of the p-type semiconductor region PW located below the gate electrode GE and the n-type source region SR and the n-type drain region DR are conducted through the channel (n-type inversion layer) and the n-type semiconductor region NW.

A source side portion of the insulating film GF existing under the gate electrode GE is composed of a relatively thin insulating film TZ, and a drain side portion thereof is composed of a relatively thick insulating film SZ. That is, the insulating film GF has the insulating film TZ and the insulating film SZ that are adjacent to each other in a plan view and, in the gate length direction of the gate electrode GE, the insulating film TZ is located on an n-type source region SR side and the film SZ is located on an n-type drain region DR side. The insulating film SZ extends in a direction of the n-type drain region DR from a position connected (adjacent) to the insulating film TZ. The thickness of the insulating film TZ is thinner than the thickness of the insulating film SZ.

The insulating film SZ is composed of a laminated film (laminated insulating film) in which a plurality of insulating films are laminated, preferably, is composed of: a silicon oxide film OX1; a silicon nitride film NT on the silicon oxide film OX1; and a silicon oxide film OX2 on the silicon nitride film NT. A laminated film of the silicon oxide film OX1, the silicon nitride film NT, and the silicon oxide film OX2 can also be regarded as an ONO (oxide-nitride-oxide) film. Each bandgap of the silicon oxide film OX1 and the silicon oxide film OX2 is larger than a bandgap of the silicon nitride film NT.

The silicon oxide film OX1 is preferably a thermal oxide film or a CVD film, the silicon nitride film NT is preferably a CVD film, and the silicon oxide film OX2 is preferably a thermal oxide film or a CVD film. Here, the thermal oxide film corresponds to a film formed by using a thermal oxidation method, and the CVD film corresponds to a film formed by using a CVD method. The thickness of the silicon oxide film OX1 can be, for example, about 5 to 15 nm (5 nm or more and 15 nm or less); the thickness of the silicon nitride film NT can be, for example, about 5 to 15 nm; and the thickness of OX2 can be, for example, about 5 to 15 nm.

The insulating film SZ has a charge holding (charge accumulation) function and, accordingly, has a function of suppressing or preventing electric charges from being injected from the semiconductor substrate SUB to the gate electrode GE. Therefore, the insulating film SZ has a laminated structure of at least three layers, and potential barrier height of an outer layer (here, a silicon nitride film NT) that function as a charge holding portion becomes lower than potential barrier height of each of outer layers (here, silicon oxide films OX1 and OX2) that function as charge block layers.

Each bandgap of a top insulating film (here, silicon oxide film OX2) and a bottom insulating film (here, silicon oxide film OX1) of the insulating film SZ is larger than a bandgap of a charge holding layer (here, silicon nitride film NT) between the top insulating film and the bottom insulating film. As a result, the top insulating film (here, silicon oxide film OX2) and the bottom insulating film (here, silicon oxide film OX1) sandwiching the charge holding layer (silicon nitride film NT) can each function as a charge block layer for confining electric charges in the charge holding layer (silicon nitride film NT).

The insulating film TZ is composed of a single-layer insulating film, preferably a silicon oxide film, more preferably a thermal oxide film (a silicon oxide film formed by a thermal oxidation method). The insulating film TZ can have a thickness of, for example, about 4 to 20 nm.

A sidewall spacer SW is formed on each side surface of the gate electrode GE. However, a sidewall spacer SW1 formed on an n-type source region SR side of the sidewall spacers SW is located on the epitaxial layer EP, and a sidewall spacer SW2 formed on an n-type drain region DR side thereof is located on the insulating film SZ. That is, the insulating film SZ has a portion that overlaps with the gate electrode GE in a plan view (that is, a portion located below the gate electrode GE) and a portion that does not overlap with the gate electrode GE in a plan view (that is, a protruding portion from the gate electrode GE in a direction of the n-type drain region DR). The sidewall spacer SW2 is formed on the insulating film SZ of a portion that does not overlap with the gate electrode GE in a plan view. Meanwhile, the sidewall spacer SW1 is formed not on the insulating film TZ but on the epitaxial layer EP (so as to contact with the epitaxial layer EP).

An insulating film (interlayer insulating film) IL is formed on the main surface of the semiconductor substrate SUB, that is, on a main surface of the epitaxial layer EP so as to cover the gate electrode GE and the sidewall spacer SW. The insulating film IL is made of, for example, a silicon oxide film. The insulating film IL can also be formed by a laminated film of a relatively thin silicon nitride film and a relatively thick silicon oxide film on the silicon nitride. An upper surface of the insulating film IL is flattened.

A contact hole (through hole) is formed in the insulating film IL, and a conductive plug (contact plug, embedded conductor portion for connection) PG mainly composed of a tungsten (W) film is embedded in the contact hole. The plug PG is formed on each of the n-type source region SR, the n-type drain region DR, and the p-type semiconductor region BC. Here, the plug PG formed on the n-type source region SR and electrically connected to the n-type source region SR is referred to as a plug PGS. Further, the plug PG formed on the n-type drain region DR and electrically connected to the n-type drain region DR is referred to as a plug PGD. Further, the plug PG formed on the p-type semiconductor region BC and electrically connected to the p-type semiconductor region BC is referred to as a plug PGB. The plug PG can also be formed on the gate electrode GE, but the plug PG on the gate electrode GE is not shown in the cross-sectional view of FIG. 1.

On the insulating film IL in which the plug PG is embedded, a wiring (first layer wiring) M1 composed of a conductive film mainly made of aluminum (Al) or an aluminum alloy is formed. The wiring M1 is preferably an aluminum wiring, but a wiring using another metal material, for example, a tungsten wiring can also be used.

The wiring M1 has: a source wiring M1S electrically connected to the n-type source region SR via the plug PGS; and a drain wiring M1D electrically connected to the n-type drain region DR via the plug PGD. Further, the source wiring M1S is electrically connected to the p-type semiconductor region BC via the plug PGB. Therefore, the same potential (source potential) as a potential supplied from the source wiring M1S to the n-type source region SR via the plug PGS is supplied from the source wiring M1S to the p-type semiconductor region BC via the plug PGB, and is further supplied from the p-type semiconductor region BC to the p-type semiconductor region PW. The wiring M1 can further have a gate wiring that is electrically connected to the gate electrode GE via the plug PG, but the gate wiring is not shown in the cross-sectional view of FIG. 1.

The illustration and description of a layer structure above the insulating film IL and the wiring M1 will be omitted here.

<Manufacturing Process of Semiconductor Device>

Next, a manufacturing process of the semiconductor device of the present embodiment will be described with reference to the drawings. FIGS. 2 to 16 are each a cross-sectional view of a main portion of the semiconductor device of the present embodiment during its manufacturing process, and a cross-sectional view corresponding to FIG. 1 is shown. Incidentally, although a preferable example of the manufacturing process of the semiconductor device of the present embodiment is described here, the present invention is not limited to this and various modifications can be made.

Figure 2:
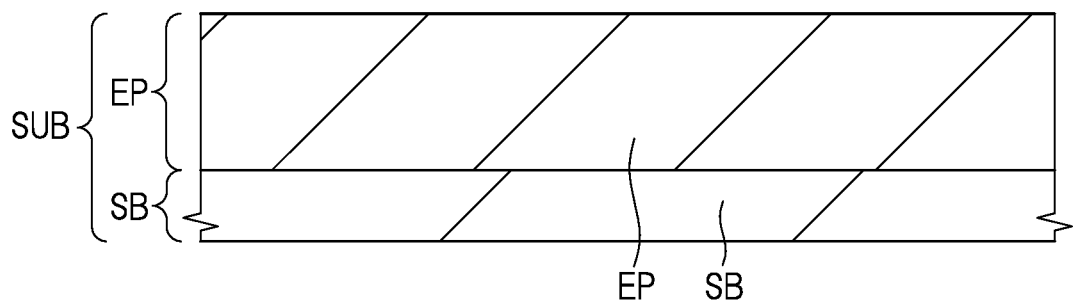
FIG. 2 is a cross-sectional view of the main portion of the semiconductor device according to the embodiment during a manufacturing process thereof.

In order to manufacture a semiconductor device, first, as shown in FIG. 2, prepared is a semiconductor substrate SUB having a substrate body SB made of, for example, p$^+$ type single crystal silicon, and an epitaxial layer EP made of p$^-$ type single crystalline silicon or the like formed on a main surface of the substrate body SB.

Next, an element separation region (not shown) is formed on the main surface of the epitaxial layer EP of the semiconductor substrate SUB by using, for example, a STI method or a LOCOS method.

Figure 3:
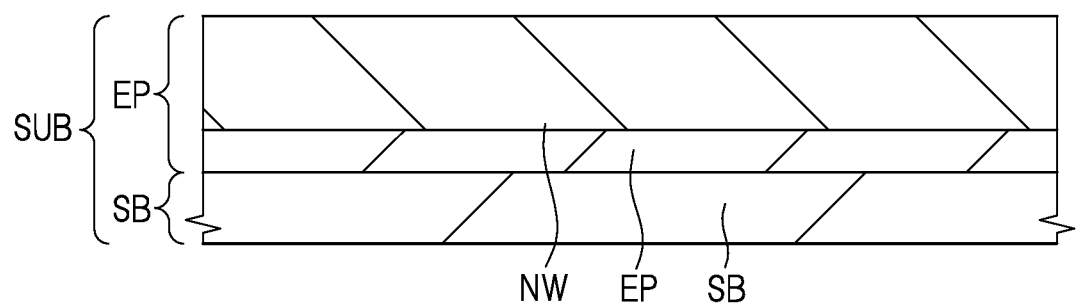
FIG. 3 is a cross-sectional view of the main portion of the semiconductor device during the manufacturing process following FIG. 2.

Next, as shown in FIG. 3, an n-type semiconductor region NW is formed by introducing an n-type impurity into an upper portion (upper layer portion) of the epitaxial layer EP of the semiconductor substrate SUB by using an ion implantation method.

Figure 4:
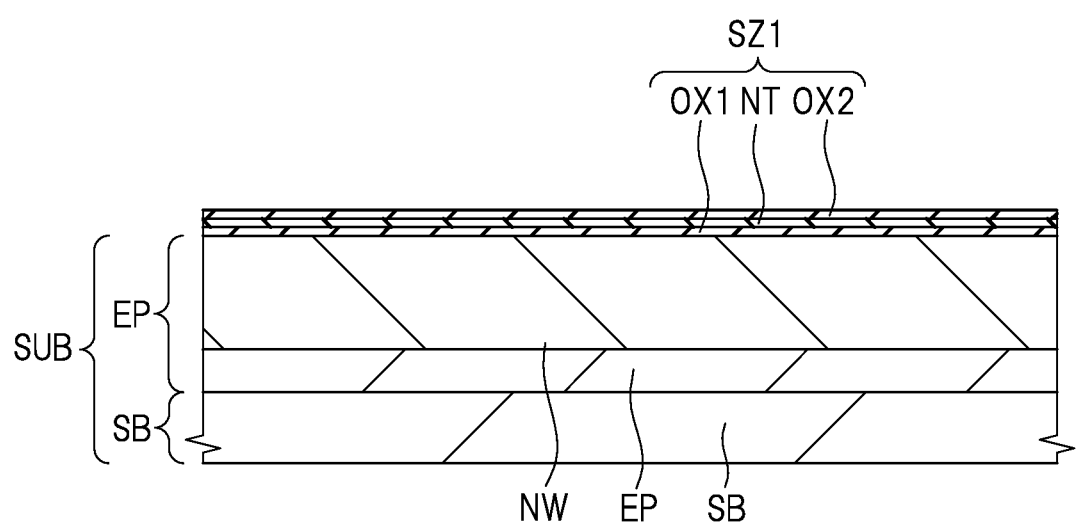
FIG. 4 is a cross-sectional view of the main portion of the semiconductor device during the manufacturing process following FIG. 3.

Next, after cleaning the surface of the epitaxial layer EP of the semiconductor substrate SUB, an insulating film SZ1 is formed on the main surface (front surface) of the epitaxial layer EP of the semiconductor substrate SUB as shown in FIG. 4. The insulating film SZ1 is composed of a laminated film (laminated insulating film) in which a plurality of insulating films are laminated, preferably a laminated film made of a silicon oxide film OX1, a silicon nitride film NT on the silicon oxide film OX1, and a silicon oxide film OX2 on the silicon nitride film NT.

To form the insulating film SZ1, for example, first, the silicon oxide film OX1 is formed by the thermal oxidation method or the CVD method, then the silicon nitride film NT is deposited on the silicon oxide film OX1 by the CVD method, and a silicon oxide film OX2 is further formed on the silicon nitride film NT by a CVD method, a thermal oxidation method, or both. Consequently, formed can be the insulating film SZ1 composed of the laminated film of the silicon oxide film OX1, the silicon nitride film NT, and the silicon oxide film OX2. Further, the silicon oxide film OX1 can also be formed before ion implantation for forming the n-type semiconductor region NW.

Figure 5:
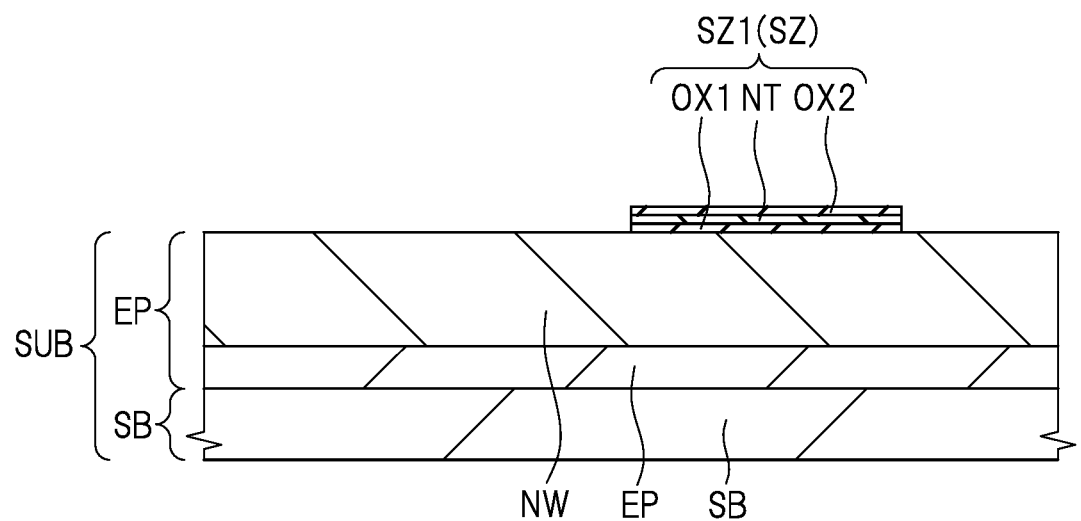
FIG. 5 is a cross-sectional view of the main portion of the semiconductor device during the manufacturing process following FIG. 4.

Next, as shown in FIG. 5, a photoresist pattern (not shown) is formed on the insulating film SZ1, and then the photoresist pattern is used as an etching mask to etch the insulating film SZ1. By doing so, an unnecessary portion (i.e., a portion exposed from the photoresist pattern) of the insulating film SZ1 is removed. Consequently, the insulating film SZ1 is patterned to form an insulating film SZ1 made of the remaining insulating film SZ1 (patterned insulating film SZ1).

Figure 6:
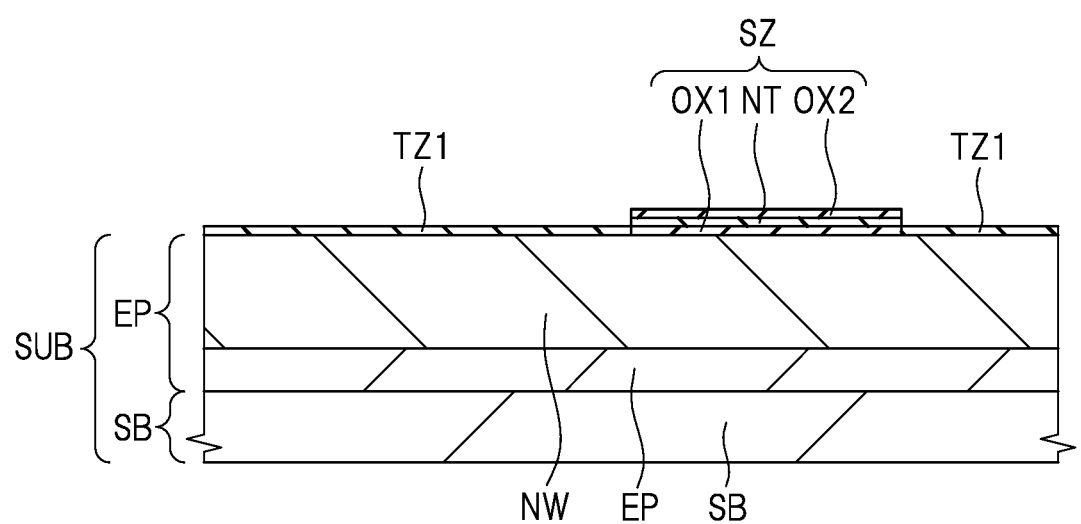
FIG. 6 is a cross-sectional view of the main portion of the semiconductor device during the manufacturing process following FIG. 5.

Next, as shown in FIG. 6, an insulating film TZ1 is formed on a surface of the epitaxial layer EP of the semiconductor substrate SUB. The insulating film TZ1 is preferably made of a silicon oxide film, and can be formed by a thermal oxidation method. The insulating film TZ1 is formed in a region, in which the insulating film SZ is not formed (that is, the exposed surface of the epitaxial layer EP), on the surface of the epitaxial layer EP. Therefore, the surface of the epitaxial layer EP of the semiconductor substrate SUB has a region in which the insulating film TZ1 is formed, and a region in which the insulating film SZ is formed, the insulating film TZ1 being formed so as to be adjacent to the insulating film SZ.

Figure 7:
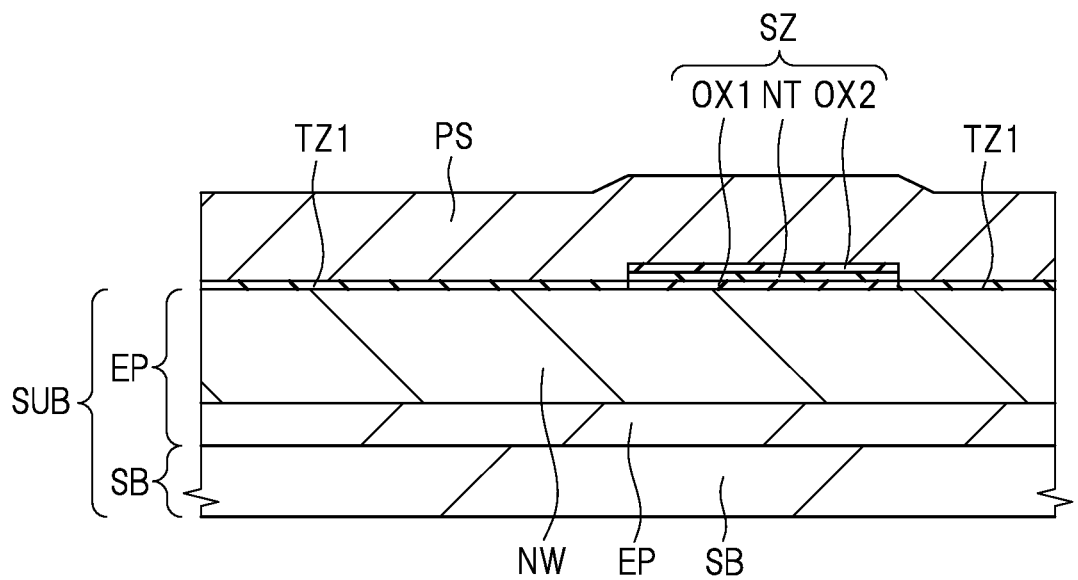
FIG. 7 is a cross-sectional view of the main portion of the semiconductor device during the manufacturing process following FIG. 6.

Next, as shown in FIG. 7, a silicon film PS is formed as a conductive film (conductor film) for the gate electrode GE on the main surface of the semiconductor substrate SUB, thus on the insulating films TZ1 and SZ. The silicon film PS is made of, for example, a polysilicon film, and can be formed by using a CVD method or the like. In the region where the insulating film SZ is formed on the surface of the epitaxial layer EP, the silicon film PS is formed on the insulating film SZ, and in the region where the insulating film TZ1 is formed on the surface of the epitaxial layer EP, the silicon film PS is formed on the insulating film TZ1. In a region where the element separation region is formed, the silicon film PS is formed on the element separation region.

Figure 8:
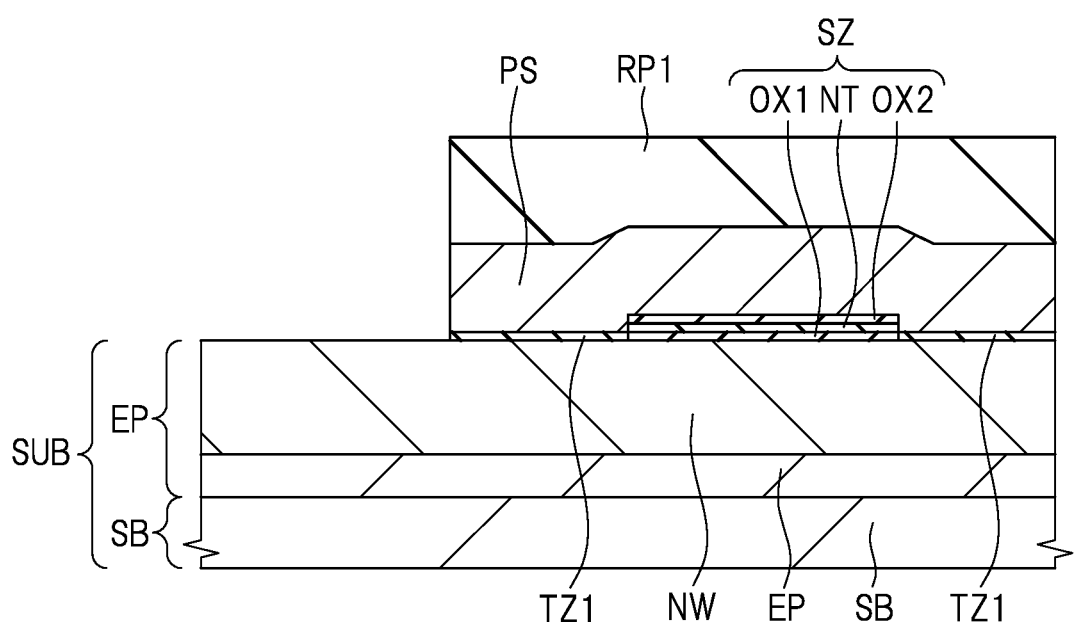
FIG. 8 is a cross-sectional view of the main portion of the semiconductor device during the manufacturing process following FIG. 7.

Next, as shown in FIG. 8, the photoresist pattern RP1 is formed on the silicon film PS. Then, the photoresist pattern RP1 is used as an etching mask to etch the silicon film PS. Consequently, the silicon film PS on the source side is removed.

Figure 9:
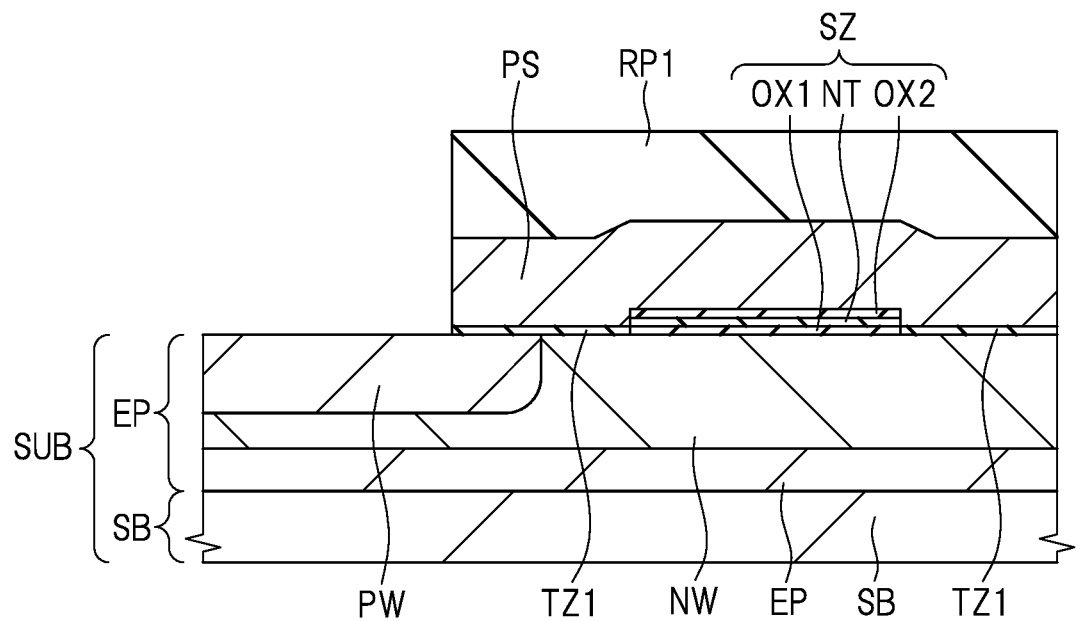
FIG. 9 is a cross-sectional view of the main portion of the semiconductor device during the manufacturing process following FIG. 8.

Next, as shown in FIG. 9, a p-type impurity is introduced into the epitaxial layer EP of the semiconductor substrate SUB by an ion implantation method through using the photoresist pattern RP1 and the silicon film PS as ion implantation element masks, and a p-type semiconductor region PW is formed in the epitaxial layer EP of the semiconductor substrate SUB. Diagonal ion implantation is used for this ion implantation. Consequently, a part of the p-type semiconductor region PW overlaps with the gate electrode GE in a plan view and, therefore, the part of the p-type semiconductor region PW exists below the gate electrode GE. Thereafter, the photoresist pattern RP1 is removed.

Figure 10:
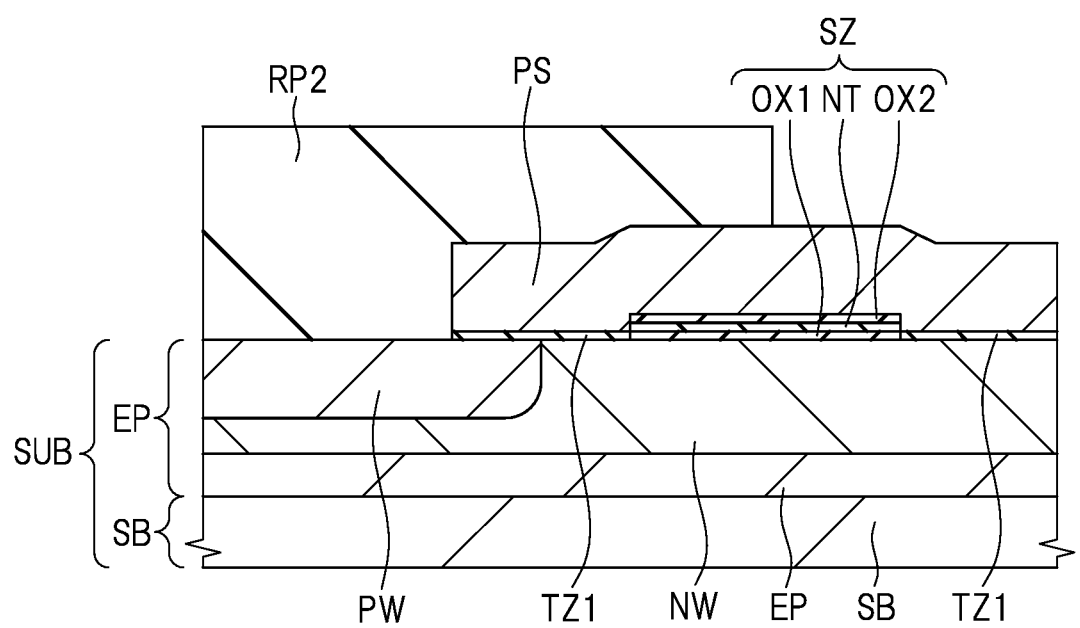
FIG. 10 is a cross-sectional view of the main portion of the semiconductor device during the manufacturing process following FIG. 9.
Figure 11:
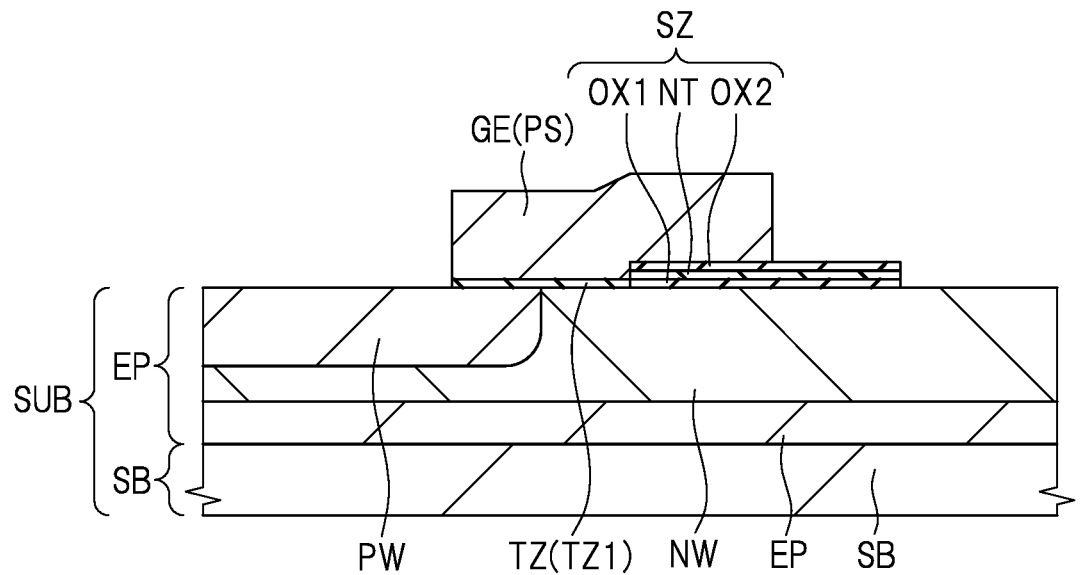
FIG. 11 is a cross-sectional view of the main portion of the semiconductor device during the manufacturing process following FIG. 10.

Next, as shown in FIG. 10, a photoresist pattern RP2 is formed on the silicon film PS. The p-type semiconductor region PW is covered with the photoresist pattern RP2. Then, the photoresist pattern RP2 is used as an etching mask to etch the silicon film PS. Consequently, the silicon film PS on the drain side is removed. The photoresist pattern RP2 is then removed, and FIG. 11 shows this step. The silicon film PS is patterned by the etching using the photoresist pattern RP1 and the etching using the photoresist pattern RP2 to form the gate electrode GE. The gate electrode GE is made of a patterned silicon film PS, a source side end (side surface) of the gate electrode GE being formed by the etching using the photoresist pattern RP1, and a drain side end (side surface) of the gate electrode GE being formed by the etching using the photoresist pattern RP2. The insulating film TZ1 remaining under the gate electrode GE becomes the above-mentioned insulating film TZ. The gate electrode GE is formed on the epitaxial layer EP of the semiconductor substrate SUB via the insulating films TZ and SZ.

Figure 12:
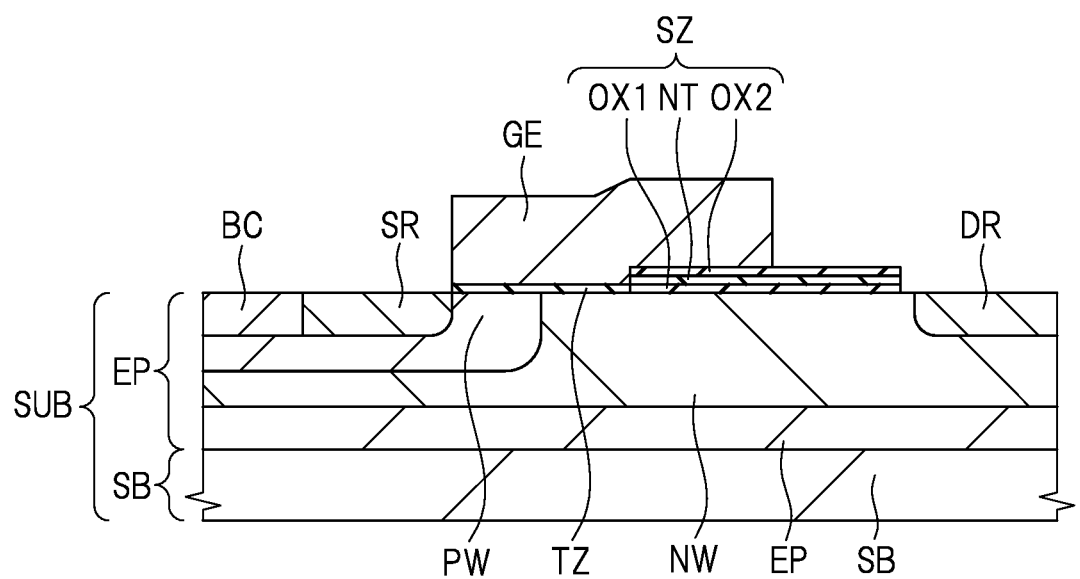
FIG. 12 is a cross-sectional view of the main portion of the semiconductor device during the manufacturing process following FIG. 11.

Next, as shown in FIG. 12, an n-type drain region DR and an n-type source region SR are formed by introducing n-type impurities into the epitaxial layer EP of the semiconductor substrate SUB through using an ion implantation method. A p-type semiconductor region BC is formed by introducing a p-type impurity into the epitaxial layer EP of the semiconductor substrate SUB through using an ion implantation method. In the epitaxial layer EP, the n-type source region SR and the p-type semiconductor region BC are formed in the p-type semiconductor region PW, and the n-type drain region DR is formed in the n-type semiconductor region NW. The n-type drain region DR and the n-type source region SR can be formed by the same ion implantation step or different ion implantation steps.

Figure 13:
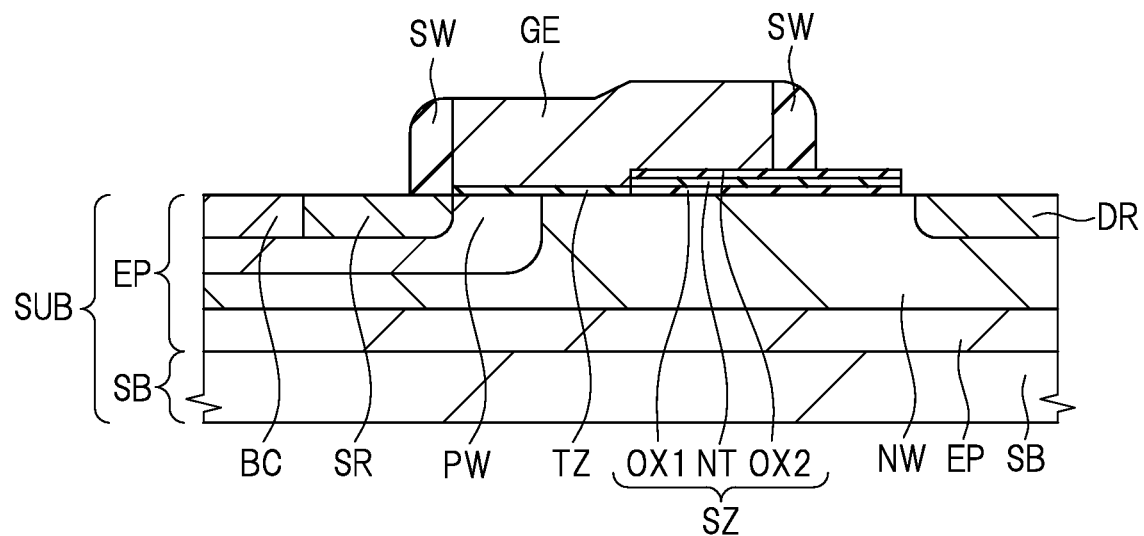
FIG. 13 is a cross-sectional view of the main portion of the semiconductor device during the manufacturing process following FIG. 12.

Next, as shown in FIG. 13, a sidewall spacer SW is formed on a side wall of the gate electrode GE. For example, an insulating film for forming the sidewall spacer SW is formed on the main surface of the semiconductor substrate SUB by using a CVD method or the like so as to cover the gate electrode GE. Then, the insulating film is etched back by using anisotropic etching technology, and the sidewall spacer SW can be formed by doing so. The sidewall spacer SW formed on the side wall of the gate electrode GE is located on the insulating film SZ. That is, a bottom surface of the sidewall spacer SW whose side surface contacts with the gate electrode GE contacts with an upper surface of the insulating film SZ. One or both of the n-type drain region DR and the n-type source region SR can also be formed after the sidewall spacer SW is formed. Further, an LDD (Lightly doped Drain) structure can be applied to the n-type source region SR.

Figure 14:
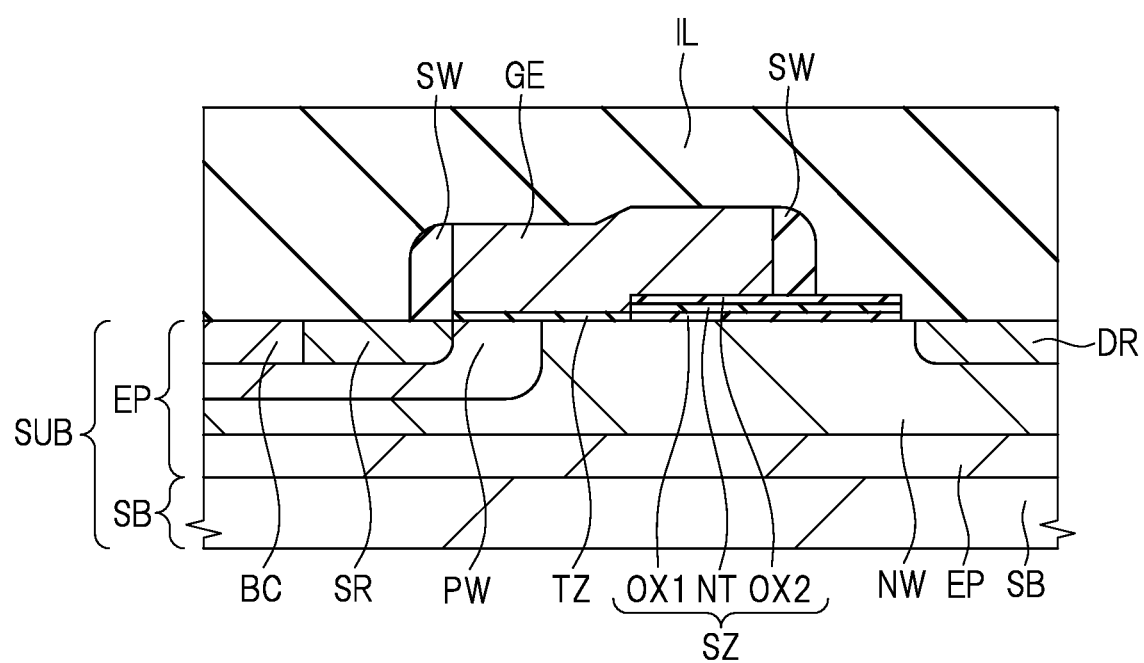
FIG. 14 is a cross-sectional view of the main portion of the semiconductor device during the manufacturing process following FIG. 13.

Next, as shown in FIG. 14, an insulating film IL as an interlayer insulating film is formed by a CVD method etc. on the main surface of the semiconductor substrate SUB, that is, on the epitaxial layer EP so as to cover the gate electrode GE and the sidewall spacer SW. After the insulating film IL is formed, an upper surface of the insulating film IL may be polished and flattened by using a CMP (Chemical Mechanical Polishing) method or the like.

Figure 15:
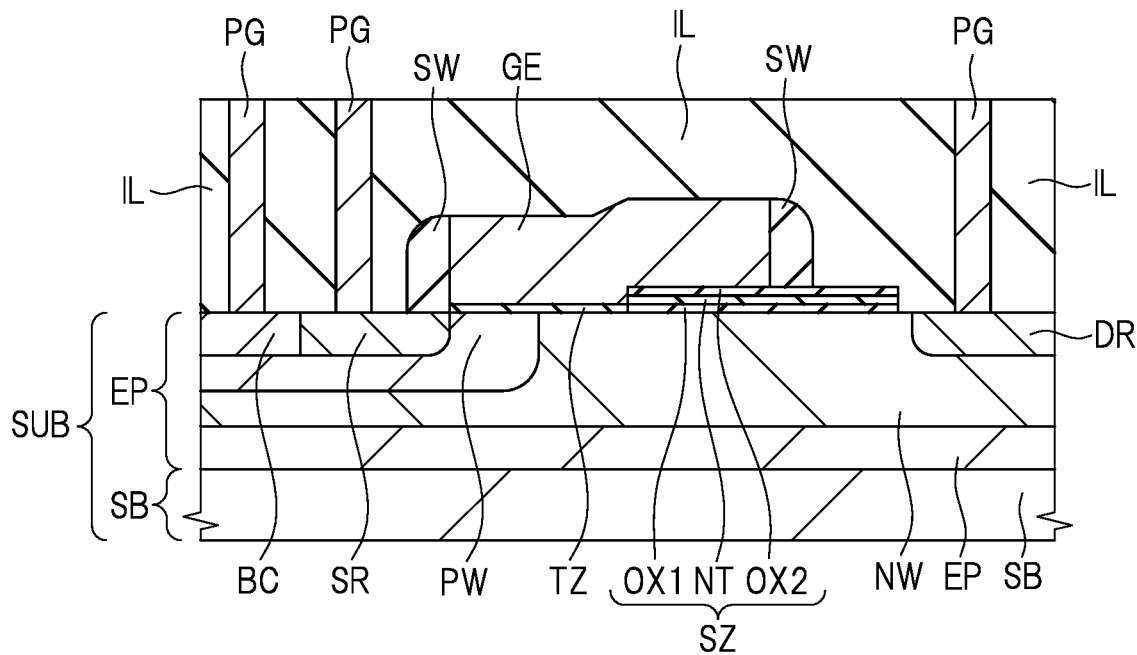
FIG. 15 is a cross-sectional view of the main portion of the semiconductor device during the manufacturing process following FIG. 14.

Next, as shown in FIG. 15, a contact hole (through hole) is formed in the insulating film IL by etching the insulating film IL through using, as an etching mask, a photoresist pattern (not shown) formed on the insulating film IL. Then, a conductive plug PG as a conductor portion for connection is formed in the contact hole.

For example, after forming a barrier conductor film on the insulating film IL including a bottom surface and a side wall (s) of the contact hole, a main conductor film (for example, a tungsten film) is formed on the barrier conductor film so as to fill an inside of the contact hole. Thereafter, the unnecessary main conductor film and barrier conductor film outside the contact hole are removed by the CMP method or the like. This makes it possible to form the plug PG.

Figure 16:
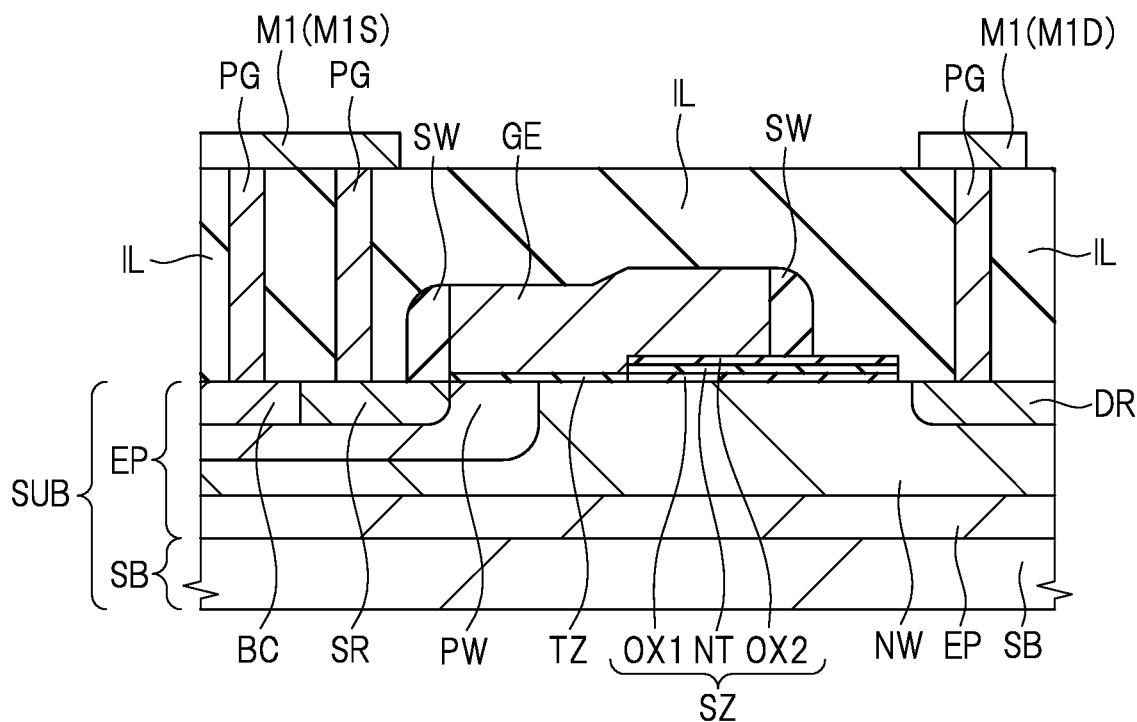
FIG. 16 is a cross-sectional view of the main portion of the semiconductor device during the manufacturing process following FIG. 15.

Next, as shown in FIG. 16, a wiring M1 is formed on the insulating film IL in which the plug PG is embedded. For example, a conductive film for forming the wiring M1 is formed on the insulating film IL in which a plug PG is embedded; then the conductive film is patterned by using a photolithography technique and an etching technique; and the wiring M1 made of the patterned conductive film can be formed. The illustration and description of subsequent steps will be omitted here.

<Main Features and Effects>

Figure 17:
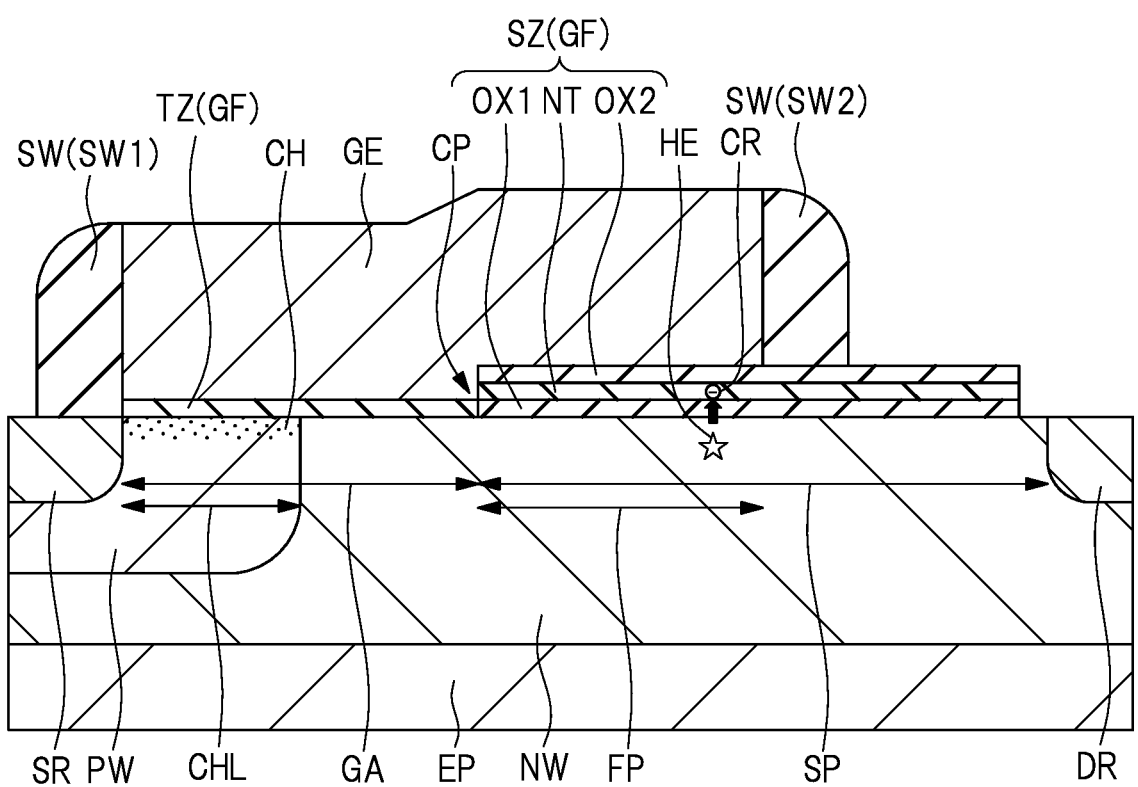
FIG. 17 is a cross-sectional view of a main portion of a semiconductor device according to one embodiment.

FIG. 17 is a cross-sectional view of a main portion of the semiconductor device of the present embodiment, and a part of FIG. 1 is enlarged and shown. When a voltage (potential) equal to or higher than the threshold voltage is applied to the gate electrode GE, a channel (n-type inversion layer) CH is formed in an upper portion (upper layer portion) of the p-type semiconductor region PW located below the gate electrode GE. However, this channel CH is shown with dot hatching in FIG. 17. When the channel CH is formed, the n-type source region SR and the n-type drain region DR are conducted through the channel CH and the n-type semiconductor region NW.

The semiconductor device of the present embodiment has: the n-type source region SR and the n-type drain region DR which are formed in the semiconductor substrate SUB apart from each other; the p-type semiconductor region PW (first semiconductor region) formed in the semiconductor substrate SUB so as to surround the n-type source region SR; and the gate electrode GE formed on the semiconductor substrate SUB between the n-type source region SR and the n-type drain region DR via the insulating film GF (gate insulating film).

One of main features of the present embodiment is that the insulating film GF, which is a gate insulating film, has the insulating film TZ (first gate insulating film) and the insulating film SZ (second gate insulating film) which are adjacent to each other in a plan view. In the gate length direction of the gate electrode GE, the insulating film TZ (first gate insulating film) is located in an n-type source region SR side, and the insulating film SZ (second gate insulating film) is located on an n-type drain region DR side, the insulating film TZ (first gate insulating film) being thinner than the insulating film SZ (second gate insulating film). The insulating film SZ (second gate insulating film) is composed of a laminated film including: a silicon oxide film OX1 (first insulating film) on the semiconductor substrate SUB; a silicon nitride film NT (second insulating film) on the silicon oxide film OX1; and a silicon oxide film OX2 (third insulating film) on the silicon nitride film NT. Each of bandgaps of the silicon oxide film OX1 (first insulating film) and the silicon oxide film OX2 (third insulating film) is larger than a bandgap of the silicon nitride film NT (second insulating film).

Here, unlike the present embodiment, it is assumed that the insulating film SZ is configured by a single-layer insulating film (for example, a silicon oxide film) without changing the overall thickness. When a potential (here, positive potential) is applied to the gate electrode GE to turn on the LDMOSFET and a high potential (here, positive high voltage) is applied to the n-type drain region DR, an electron-hole pair is generated at an electric field concentration point by impact ionization. Carriers (electric charges, for example, electrons) generated by this may be injected into the gate electrode GE through the insulating film GF, and such injection deteriorates the insulating film GF through which the carriers have passed, and operates so as to lower reliability of the insulating film GF. For example, deterioration of the insulating film GF makes it easy to cause a leak between the gate electrode GE and the semiconductor substrate SUB and, as a result, brings the lowering of the reliability of the semiconductor device. Therefore, in order to improve the reliability of the semiconductor device, it is desired to suppress a phenomenon in which the carriers generated by the impact ionization are injected into the gate electrode GE through the insulating film GF.

In contrast, in the present embodiment, the insulating film GF which is a gate insulating film has the insulating film TZ and the insulating film SZ that are adjacent to each other in a plan view. The insulating film SZ located on the n-type drain region DR side is composed of the laminated film including: the silicon oxide film OX1 (first insulating film) on the semiconductor substrate SUB; the silicon nitride film NT (second insulating film) on the silicon oxide film OX1; and the silicon oxide film OX2 (third insulating film) on the silicon nitride film NT.

As described above, the carriers (electric charges, for example, electrons) generated by the impact ionization are about to be injected into the gate electrode GE through the insulating film SZ. However, each bandgap of the silicon oxide film OX1 (first insulating film) and the silicon oxide film OX2 (third insulating film) is larger than a bandgap of the silicon nitride film NT (second insulating film). Consequently, in the insulating film SZ, potential barrier height of an inner layer (here, silicon nitride NT) functioning as a charge holding portion is lower than potential barrier height of an outer layer (here, silicon oxide films OX1 and OX2) functioning as a charge block layer, and a potential well is formed. Therefore, even if the carriers (electric charges, for example, electrons) generated by the impact ionization pass through (tunnel in) the silicon oxide film OX1 (first insulating film) from the semiconductor substrate SUB and are injected into the silicon nitride film NT (second insulating film), it is difficult for the carriers to overcome the potential barrier between the silicon oxide film OX2 (third insulating film) and the silicon nitride film NT (second insulating film) and the carriers are retained by the silicon nitride film NT. This makes it possible to suppress or prevent the phenomenon in which the carriers generated by the impact ionization are injected into the gate electrode GE through the insulating film SZ. Therefore, deterioration of the insulating film GF (SZ) due to passage of the carriers can be suppressed or prevented, so that the reliability of the insulating film GF can be improved and, as a result, the reliability of the semiconductor device can be improved. For example, an increase in a leakage current due to the deterioration of the insulating film GF can be suppressed or prevented.

For example, in FIG. 17, an electron-hole pair is generated by the impact ionization at a portion HE indicated by an asterisk (*), and the carriers (electric charges, for example, electrons) CR generated by the pair pass through the silicon oxide film OX1, are injected into the silicon nitride film NT, and are held by the silicon nitride film NT without passing through the silicon oxide film OX2. Such a state is schematically shown by FIG. 17.

Also, the impact ionization is more likely to occur in a region where the electric field is concentrated, and is more likely to occur in a region close to the n-type drain region DR than in a region close to the n-type source region SR. Consequently, in the insulating films TZ and SZ adjacent to each other in a plan view, the insulating film SZ located on the n-type drain region DR side is more easily affected from the carrier generated by the impact ionization than the insulating film TZ located on the n-type source region SR side.

Thus, in the present embodiment, the insulating film SZ located on the n-type drain region DR side in the insulating film TZ and the insulating film SZ adopts a structure in which the silicon nitride film NT (second insulating film) having a relatively small bandgap is sandwiched between the silicon oxide films OX1 and OX2 (first and third insulating films) each having a relatively large bandgap. This makes it possible to suppress or prevent the phenomenon in which the carriers generated by the impact ionization are injected into the gate electrode GE through the insulating film SZ, so that the reliability of the insulating film GF, which is a gate insulating film, can be enhanced and the reliability of the semiconductor device can be improved. Meanwhile, the insulating film TZ located on the n-type source region SR side in the insulating film TZ and the insulating film SZ has small amounts of concern about the phenomenon in which the carriers generated by the impact ionization are injected into the gate electrode GE through the insulating film TZ. Therefore, in the present embodiment, the thickness of the insulating film TZ located on the n-type source region SR side is thinner than that of the insulating film SZ located on the n-type drain region DR side. Reducing the thickness of the insulating film TZ located on the n-type source region SR side makes it easy to form a channel CH under the insulating film TZ in the semiconductor substrate SUB. This makes it easy to control the LDMOSFET and makes it possible to, for example, lower the threshold voltage of the LDMOSFET.

The insulating film TZ is interposed between the channel formation region (channel CH) of the LDMOSFET and the gate electrode GE. It is preferable that the gate insulating film SZ is not arranged between the channel formation region (channel CH) of the LDMOSFET and the gate electrode GE. Consequently, what exists on the channel formation region (channel CH) is not the thick insulating film SZ but the insulating film TZ thinner than the insulating film SZ. Therefore, the channel CH is easily formed by applying a voltage to the gate electrode GE, and the threshold voltage of the LDMOSFET can efficiently be reduced. That is, reducing the thickness of the gate insulating film on the channel formation region has the effect of lowering the threshold voltage and, in the present embodiment, arranging not the insulating film SZ but the insulating film TZ thinner than the insulating film SZ on the channel formation region makes it possible to lower the threshold voltage. Incidentally, the channel formation region is a region in which the channel CH is formed when a voltage equal to or higher than the threshold voltage is applied to the gate electrode GE to turn on the LDMOSFET. As can be seen from FIG. 17, an upper portion of the p-type semiconductor region PW (first semiconductor region) between the n-type source region SR and the n-type drain region DR corresponds to the channel formation region.

Further, in the gate length direction of the gate electrode GE, a connection portion (adjacent position) CP between the insulating film TZ and the gate insulating film SZ is located on the n-type drain region DR side of the channel formation region. Specifically, in the gate length direction of the gate electrode GE, the connection portion (adjacent position) CP between the insulating film TZ and the gate insulating film SZ is located closer to the n-type drain region DR side than to the channel formation region. Specifically, in the gate length direction of the gate electrode GE, the connection portion (adjacent position) CP between the insulating film TZ and the gate insulating film SZ is located on not the channel formation region (not the p-type semiconductor region PW, accordingly) but the n-type semiconductor region NW. Consequently, what exists on the channel formation region (channel CH) is not the thick insulating film SZ but the insulating film TZ thinner than the insulating film SZ, so that the channel CH is easily formed by applying a voltage to the gate electrode GE and the threshold voltage of the LDMOSFET can efficiently be reduced.

Further, the insulating film TZ is preferably made of a single-layer insulating film. This makes it possible to accurately reduce the thickness of the insulating film TZ and easy to control the thickness of the insulating film TZ. Further, it is more preferable that the insulating film TZ is composed of a single-layer silicon oxide film and, in this case, the reliability of the insulating film TZ that functions as a gate insulating film can be further improved.

In addition, in view of the insulating film TZ and the insulating film SZ being adjacent to each other in a plan view and of the insulating film SZ being thicker than the insulating film TZ, a step (a difference in a height position of the upper surface) exists at the connection portion (adjacent position) CP between the insulating film TZ and the insulating film SZ. The step of the connection portion CP is covered with the gate electrode GE.

Further, in the present embodiment, the insulating film SZ applies a structure in which an intermediate layer (silicon nitride film NT) having a relatively small bandgap is sandwiched between an upper layer (silicon oxide film OX1) and a lower layer (silicon oxide film OX2) having relatively larger bandgaps than it. In order to realize this, the silicon nitride film NT is used as an intermediate layer having a relatively small bandgap, and the silicon oxide film OX1 and the silicon oxide film OX2 are used as an upper layer and a lower layer having relatively large bandgaps. As another form, in the insulating film SZ, a film other than the silicon nitride film can be used as an intermediate layer having a relatively small bandgap, and a film other than the silicon oxide film can be used as an upper layer and a lower layer having relatively large bandgaps. Even in that case, even if the carriers generated by the impact ionization pass through the lower layer of the insulating film SZ and are injected into the intermediate layer of the insulating film SZ, it is difficult for the carriers to overcome a potential barrier between the intermediate layer and the upper layer of the insulating film SZ and the carriers is retained in the intermediate layer. This makes it possible to suppress or prevent the phenomenon in which the carriers generated by the impact ionization are injected into the gate electrode GE through the insulating film SZ, so that the reliability of the insulating film GF can be improved and the reliability of the semiconductor device can be improved.

However, the silicon oxide film and the silicon nitride film easily form a film having a good film quality. Therefore, it is more preferable that, in the insulating film SZ, the silicon nitride film NT is used as an intermediate layer having a relatively small bandgap and the silicon oxide film OX1 and the silicon oxide film OX2 are used as the upper layer and the lower layer having relatively large bandgaps. Consequently, the reliability of the insulating film GF can be further improved, so that the reliability of the semiconductor device can be further improved. In addition, the insulating film SZ can also be easily formed.

Next, various dimensions will be illustrated with reference to FIG. 17, but the present invention is not limited to this.

A channel length CHL can be, for example, about 0.15 to 0.3 μm. Further, a length GA of the insulating film TZ existing under the gate electrode GE (length of the gate electrode GE in the gate length direction) can be, for example, about 0.4 to 0.7 μm. When the breakdown voltage of the LDMOSFET is increased, the length GA is increased (lengthened). In addition, a distance SP from the connection portion CP between the insulating film TZ and the gate insulating film SZ to the n-type drain region DR (distance of the gate electrode GE in the gate length direction) SP can be, for example, about 0.2 to 1.5 μm. When the breakdown voltage of the LDMOSFET is increased, the distance SP is increased (lengthened). Further, a length FP of the insulating film SZ existing under the gate electrode GE (length of the gate electrode GE in the gate length direction) can be changed according to requirement characteristics of the LD MOSFET, and may be set to about half of the distance SP, for example.

Second Embodiment

Figure 18:
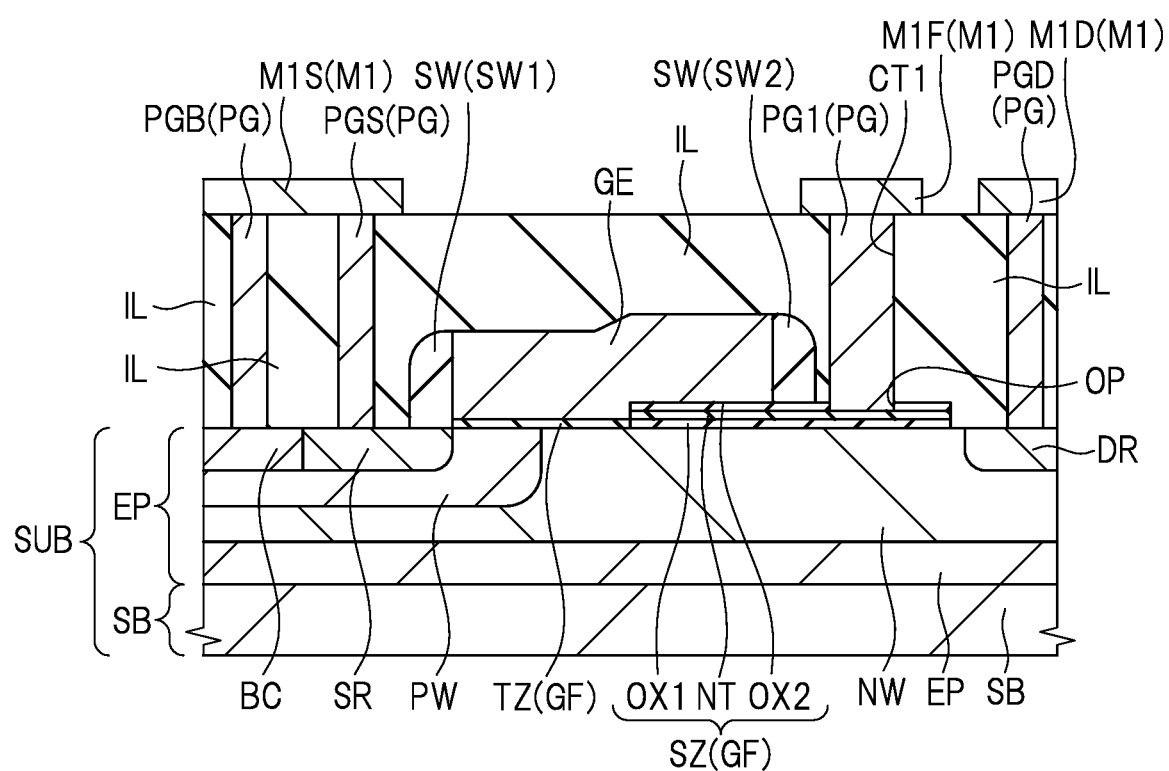
FIG. 18 is a cross-sectional view of a main portion of a semiconductor device according to another embodiment.

FIG. 18 is a cross-sectional view of a main portion of a semiconductor device according to a second embodiment, and corresponds to FIG. 1 as described above.

A semiconductor device of a second embodiment (FIG. 18) is different from the semiconductor device of the first embodiment (FIG. 1) in the following points. That is, the semiconductor device of the second embodiment shown in FIG. 18 includes, as the plug PG, not only the above plugs PGS, PGD, and PGB but also a plug (contact plug) PG1 for connecting it to the insulating film SZ.

The plug PG1 is arranged between the n-type drain region DR and the gate electrode GE in the gate length direction of the gate electrode GE. The plug PG1 can function as a field plate (field plate electrode). The plug PG1 is embedded in a contact hole (through hole) CT1 formed in the insulating film IL.

The insulating film SZ has: a portion that overlaps with the gate electrode GE in a plan view (that is, a portion located below the gate electrode GE); and a portion that does not overlap with the gate electrode GE in a plan view (that is, a portion protruding from the gate electrode GE in a direction of the n-type drain region DR). The plug PG1 is formed on the insulating film SZ in the portion that does not overlap with the gate electrode GE in a plan view. In other words, the plug PG1 is formed on the insulating film SZ in a portion exposed from the gate electrode GE without being covered with the gate electrode GE.

A contact hole CT1 in which the plug PG1 is embedded penetrates not only the insulating film IL but also the silicon oxide film OX2 of the insulating film SZ and reaches the silicon nitride film NT of the insulating film SZ. In other words, the silicon oxide film OX2 has an opening OP communicating with the contact hole CT1 of the insulating film IL, and the silicon nitride film NT is exposed from the opening OP of the silicon oxide film OX2. The opening OP is an opening formed in the silicon oxide film OX2 so as to expose a part of the silicon nitride film NT, but a portion formed in the silicon oxide film OX2 within the contact hole CT1 is also called an opening OP. The plug PG1 is embedded in the contact hole CT1 of the insulating film IL and the opening OP of the silicon oxide film OX2, and the plug PG1 is connected to the silicon nitride film NT via the opening OP of the silicon oxide film OX2. That is, a bottom surface of the plug PG1 is connected to the silicon nitride film NT exposed from the opening OP of the silicon oxide film OX2 and, more specifically, the bottom surface of the plug PG1 contacts with the silicon nitride film NT exposed from the opening OP of the silicon oxide film OX2. Further, the plug PG1 is electrically connected to the wiring M1 (M1F).

Another configuration of the semiconductor device of the second embodiment (FIG. 18) is almost the same as that of the semiconductor device of the first embodiment (FIG. 1), so that a repetitive description thereof will be omitted here.

The semiconductor device of the second embodiment also includes a plug PG1 for connecting to the insulating film SZ, and the plug PG1 is connected to the silicon nitride film NT via the opening OP of the silicon oxide film OX2. Consequently, when the carriers generated by the impact ionization are injected into the silicon nitride film NT through the silicon oxide film OX1 and are held by the silicon nitride film NT without passing through the silicon oxide film OX2, the carrier (electric charges) held in the silicon oxide film OX2 can be extracted from the silicon oxide film OX2 by the plug PG1. Thus, a charge amount accumulated in the silicon nitride film NT of the insulating film SZ can be suppressed, so that the electric charges accumulated in the silicon nitride film NT of the insulating film SZ can be suppressed or prevented from affecting an operation of the LDMOSFET. Therefore, the reliability of the semiconductor device can be further improved.

In addition, since the plug PG1 can also function as a field plate, an effect of electric field relaxation by the plug PG1 can also be obtained. Therefore, performance of the semiconductor device having the LDMOSFET can be improved.

Third Embodiment

Figure 19:
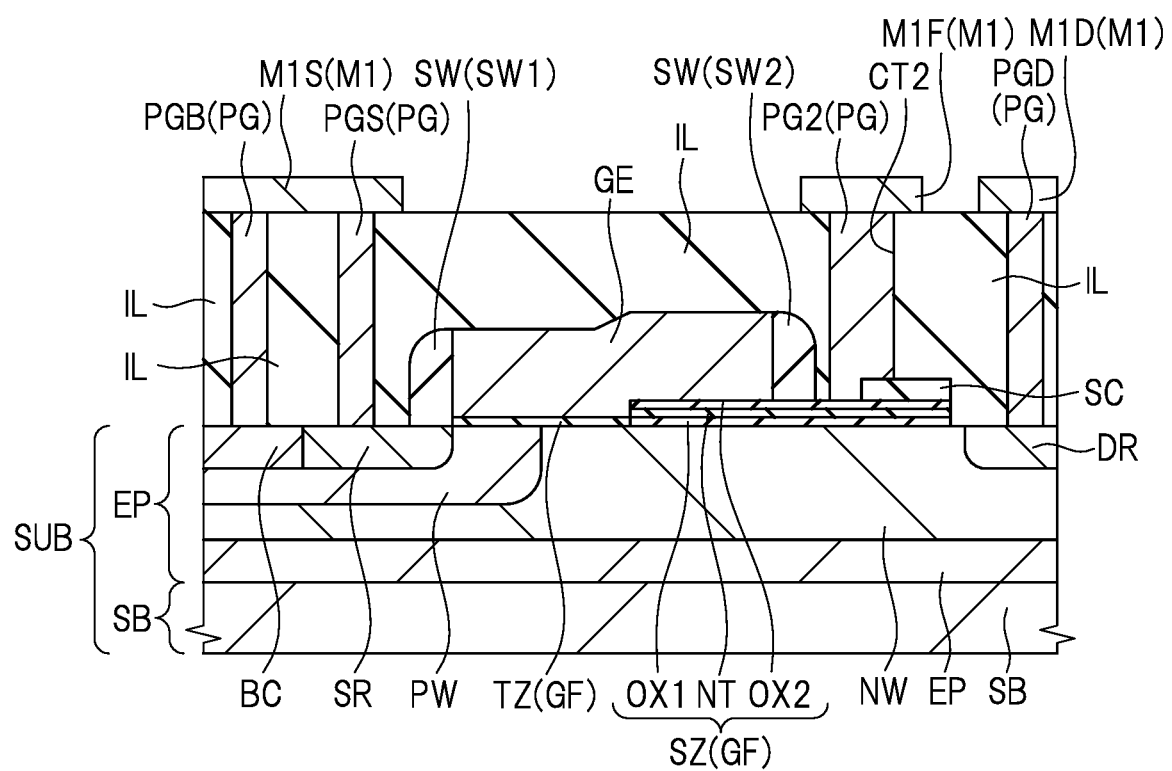
FIG. 19 is a cross-sectional view of a main portion of a semiconductor device according to yet another embodiment.

FIG. 19 is a cross-sectional view of a main portion of a semiconductor device according to a third embodiment, and corresponds to FIGS. 1 and 18 as mentioned above.

A semiconductor device of a third embodiment (FIG. 19) is different from the semiconductor device of the first embodiment (FIG. 1) in the following points. That is, as shown in FIG. 19, the semiconductor device of the third embodiment includes, as the plug PG, not only the above-mentioned plugs PGS, PGD, and PGB but also a plug (contact plug) PG2 for connecting it to the insulating film SZ. As shown in FIG. 19, the semiconductor device of the third embodiment further has an insulating film SC that partially covers the insulating film SZ exposed from the gate electrode GE.

The plug PG2 is arranged between the n-type drain region DR and the gate electrode GE in the gate length direction of the gate electrode GE. The plug PG2 can function as a field plate (field plate electrode). The plug PG2 is embedded in a contact hole (through hole) CT2 formed in the insulating film IL.

The insulating film SZ has: a portion that overlaps with the gate electrode GE in a plan view (that is, a portion located below the gate electrode GE); and a portion that does not overlap with the gate electrode GE in a plan view (that is, a portion protruding from the gate electrode GE in the direction of the n-type drain region DR). The plug PG2 is formed on the insulating film SZ within the portion that does not overlap with the gate electrode GE in a plan view. In other words, the plug PG2 is formed on the insulating film SZ in the portion exposed from the gate electrode GE without being covered with the gate electrode GE. Further, the insulating film SC is formed on the insulating film SZ in the portion that does not overlap with the gate electrode GE in a plan view. In other words, the insulating film SC is formed on the insulating film SZ in the portion exposed from the gate electrode GE without being covered with the gate electrode GE. Further, the plug PG is electrically connected to the wiring M1 (M1F).

In a plan view, the contact hole CT2 partially overlaps with the insulating film SC and, accordingly, the plug PG2 partially overlaps with the insulating film SC. Exposed at a bottom of the contact hole CT2 are the insulating film SC and the silicon oxide film OX2 of the insulating film SZ in the portion not covered with the insulating film SC. Consequently, one part of the bottom of the plug PG2 is connected to the silicon oxide film OX2 of the insulating film SZ, and the other part of the bottom of the plug PG2 is connected to the insulating film SC. That is, the one part of the bottom of the plug PG2 contacts with the silicon oxide film OX2 of the insulating film SZ in the portion which is not covered with the insulating film SC, and the other part of the bottom of the plug PG2 contacts with the insulating film SC. In other words, the bottom of the plug PG2 has: a portion located on the silicon oxide film OX2 of the insulating film SZ in the portion not covered with the insulating film SC; and a portion located on the insulating film SC.

A height position of the upper surface of the insulating film SC on the silicon oxide film OX2 is higher than a height position of the upper surface of the silicon oxide film OX2. Consequently, a step is formed on the bottom surface of the plug PG2 and, in the bottom surface of the plug PG2, a portion that connects (contacts) with the insulating film SC is higher than a portion that connects (contacts) with the silicon oxide film OX2. In the bottom surface of the plug PG2, a portion that connects (contacts) with the silicon oxide film OX2 is located on the gate electrode GE side, and a portion that connects (contacts) with the insulating film SC is located on the n-type drain region DR side. Therefore, in the bottom surface (bottom portion) of the plug PG2, a portion on the n-type drain region DR side (that is, a portion connected to the silicon oxide film OX2) is higher in position than a portion on the gate electrode GE side (that is, a portion connected to the silicon oxide film OX2).

Here, used as the insulating film SC can be a silicide block film. The silicide block film corresponds to a film used for covering a region (semiconductor region) in which a metal silicide layer should be prevented from being formed when a metal silicide layer is formed by using a Salicide (Self Aligned Silicide) technique.

Another configuration of the semiconductor device of the third embodiment (FIG. 19) is substantially the same as that of the semiconductor device of the first embodiment (FIG. 1), so that a repetitive description thereof will be omitted here.

The semiconductor device of the third embodiment also has a plug PG2 for connecting the insulating film SC and the silicon oxide film OX2 in the portion not covered with the insulating film SC. Since the plug PG2 can function as a field plate, the effect of the electric field relaxation due to the plug PG2 can be obtained. Regarding a height position of the bottom surface (bottom) of the plug PG2, the portion on the n-type drain region DR side (that is, the portion connected to the silicon oxide film OX2) is higher in position than the portion on the gate electrode GE side (that is, the portion connected to the silicon oxide film OX2). Consequently, the distance from the semiconductor substrate SUB (epitaxial layer EP) to the plug PG2 is set so that, in the bottom surface of the plug PG2, the portion on the n-type drain region DR side (that is, the portion connected to the silicon oxide film OX2) is larger than the portion on the gate electrode GE side (that is, the portion connected to the silicon oxide film OX2). This makes it possible to further enhance the effect of the electric field relaxation due to the plug PG2 serving as a field plate. Therefore, the performance of the semiconductor device having the LDMOSFET can be further improved.

As described above, the invention made by the present inventors has been specifically described based on the embodiments thereof, but the present invention is not limited to the above embodiments and, needless to say, can be variously modified without departing from the scope thereof.

What is claimed is:

1. A semiconductor device comprising:
a semiconductor substrate;
a first conductive type source region for a MISFET and a first conductive type drain region for the MISFET, the source and drain regions being formed in the semiconductor substrate so as to be separated from each other;
a second conductive type first semiconductor region formed in the semiconductor substrate so as to surround the source region, the second conductive type being opposite to the first conductive type; and
a gate electrode for the MISFET, the gate electrode being formed on the semiconductor substrate between the source region and the drain region via a gate insulating film,
wherein the gate insulating film has a first gate insulating film and a second gate insulating film that are adjacent to each other in a plan view,
wherein the semiconductor device further comprises a first contact plug for connecting with the second gate insulating film,
wherein, in a gate length direction of the gate electrode, the first gate insulating film is located on a side of the source region, and the second gate insulating film is located on a side of the drain region,
wherein the first gate insulating film is thinner than the second gate insulating film,
wherein the second gate insulating film is made of a laminated film having a first insulating film on the semiconductor substrate, a second insulating film on the first insulating film, and a third insulating film on the second insulating film,
wherein each bandgap of the first insulating film and the third insulating film is larger than a bandgap of the second insulating film,
wherein the third insulating film has a first opening formed so as to expose a part of the second insulating film, and
wherein the first contact plug is connected to the second insulating film via the first opening.

2. The semiconductor device according to claim 1, wherein the first gate insulating film is composed of a single-layer insulating film.

3. The semiconductor device according to claim 1, wherein the MISFET is an LDMOSFET.

4. The semiconductor device according to claim 1, wherein the first gate insulating film is interposed between a channel formation region of the MISFET and the gate electrode.

5. The semiconductor device according to claim 4, wherein the second gate insulating film is not arranged between the channel formation region and the gate electrode.

6. The semiconductor device according to claim 5, wherein an upper portion of the first semiconductor region between the source region and the drain region is the channel formation region.

7. The semiconductor device according to claim 4, wherein, in a gate length direction of the gate electrode, a connection portion between the first gate insulating film and the second gate insulating film is located closer to a side of the drain region than to a side of the channel formation region.

8. The semiconductor device according to claim 1, further comprising a first conductive type second semiconductor region interposed between the first semiconductor region and the drain region in the gate length direction of the gate electrode,
wherein an impurity concentration of the second semiconductor region is lower than an impurity concentration of the drain region.

9. The semiconductor device according to claim 1,
wherein the first insulating film and the third insulating film are each made of a silicon oxide film, and
wherein the second insulating film is made of a silicon nitride film.

10. The semiconductor device according to claim 9,
wherein the first insulating film has a thickness of 5 nm or more and 15 nm or less,
wherein the second insulating film has a thickness of 5 nm or more and 15 nm or less, and
wherein the third insulating film has a thickness of 5 nm or more and 15 nm or less.

11. The semiconductor device according to claim 9, wherein the first gate insulating film is made of a silicon oxide film.

12. The semiconductor device according to claim 11, wherein the first gate insulating film has a thickness of 4 nm or more and 20 nm or less.

13. The semiconductor device according to claim 1, wherein a connection portion between the first gate insulating film and the second gate insulating film has a step.

14. The semiconductor device according to claim 13, wherein the step is covered with the gate electrode.

15. The semiconductor device according to claim 1, further comprising a sidewall spacer formed on a side surface of the gate electrode,
wherein a first sidewall spacer formed on a side of the source region in the sidewall spacer is located on the semiconductor substrate, and a second sidewall spacer formed on a side of the drain region therein is located on the second gate insulating film.

16. A semiconductor device comprising: a semiconductor substrate; a first conductive type source region for a MISFET and a first conductive type drain region for the MISFET, the source and drain regions being formed in the semiconductor substrate so as to be separated from each other; a second conductive type first semiconductor region formed in the semiconductor substrate so as to surround the source region, the second conductive type being opposite to the first conductive type; and a gate electrode for the MISFET, the gate electrode being formed on the semiconductor substrate between the source region and the drain region via a gate insulating film, wherein the gate insulating film has a first gate insulating film and a second gate insulating film that are adjacent to each other in a plan view, wherein the semiconductor device further comprises: a contact plug connecting with the second gate insulating film; and a fourth insulating film formed so as to partially cover the second gate insulating film exposed from the gate electrode, wherein, in a gate length direction of the gate electrode, the first gate insulating film is located on a side of the source region, and the second gate insulating film is located on a side of the drain region, wherein the first gate insulating film is thinner than the second gate insulating film, wherein the second gate insulating film is made of a laminated film having a first insulating film on the semiconductor substrate, a second insulating film on the first insulating film, and a third insulating film on the second insulating film, wherein each bandgap of the first insulating film and the third insulating film is larger than a bandgap of the second insulating film, and wherein one part of a bottom of the second contact plug is connected to the third insulating film, and the other part of the bottom of the second contact plug is connected to the fourth insulating film.

* * * * *